United States Patent [19]
Morita et al.

[11] Patent Number: 5,667,130
[45] Date of Patent: Sep. 16, 1997

[54] ULTRASONIC WIRE BONDING APPARATUS AND METHOD

[75] Inventors: Makoto Morita, Neyagawa; Masaru Nagaike, Hirakata; Richard Gueler, Osaka; Makoto Imanishi, Hirakata; Takahiro Yonezawa, Neyagawa, all of Japan

[73] Assignee: Matsushita Electric Industrial Co., Ltd., Osaka, Japan

[21] Appl. No.: 382,527

[22] Filed: Feb. 2, 1995

[30] Foreign Application Priority Data

Feb. 3, 1994 [JP] Japan .................. 6-011541

[51] Int. Cl.$^6$ ................................. B23K 20/10
[52] U.S. Cl. ........................ 228/110.1; 228/1.1
[58] Field of Search ................... 228/110.1, 1.1

[56] References Cited

U.S. PATENT DOCUMENTS

| | | | |
|---|---|---|---|
| 4,893,742 | 1/1990 | Bullock | 228/180.5 |
| 5,377,894 | 1/1995 | Mizoguchi et al. | 228/1.1 |
| 5,385,288 | 1/1995 | Kyomasu et al. | 228/110.1 |

FOREIGN PATENT DOCUMENTS

| | | | |
|---|---|---|---|
| 965674 | 10/1982 | U.S.S.R. | 228/1.1 |
| 1248742 | 8/1986 | U.S.S.R. | 228/1.1 |

*Primary Examiner*—P. Austin Bradley
*Assistant Examiner*—Jeffrey T. Knapp
*Attorney, Agent, or Firm*—Wenderoth, Lind & Ponack

[57] ABSTRACT

An ultrasonic wire bonding apparatus and method is capable of maintaining a sufficient clearance between the horn and bonding surface, and thereby increase the working area without using a long horn. In the ultrasonic wire bonding apparatus, a capillary is located at the front end of a horn for holding a wire that is directly supported at the front end of the horn. The capillary is long enough to maintain a sufficient clearance between the horn and the bonding surface. Alternatively, a capillary, which is located at the front end of a horn for holding a wire, is short and is supported at the front end of the horn through a joint or extension. The total length of the joint and the capillary is enough to maintain a sufficient clearance between the horn and the bonding surface.

17 Claims, 8 Drawing Sheets

ULTRASONIC WIRE BONDING APPARATUS AND METHOD

BACKGROUND OF THE INVENTION

The present invention relates to an ultrasonic wire bonding apparatus and method for generating ultrasonic vibrations, guiding a wire, and bonding the wire on a specified surface with a high degree of precision. As one example, the ultrasonic wire bonding apparatus and method can be used in coupling a printed circuit board and a semiconductor chip with a wire. The ultrasonic wire bonding apparatus and method can also be constituted such that the wire bonding method for bonding a wire by employing ball bonding techniques may be applied.

Ultrasonic wire bonding is usually employed in semiconductor manufacturing processes or the like. An ultrasonic wire bonding apparatus (tool) is used for attaching a tiny wire between a semiconductor chip and a package or a workpiece. Herein, the workpiece generally refers to an integrated circuit (IC) package or a printed circuit board.

An ultrasonic wire bonding apparatus is designed to bond a wire by vibrating the wire at a high frequency of about 60,000 Hz or more. In this ultrasonic wire bonding apparatus, the wire is vibrated while pressing the wire against the bonding surface. The wire oscillates so as to be displaced in a parallel direction to the horizontal plane of the bonding surface. As the wire oscillates against the bonding surface, plastic deformation of the wire and the bonding surface occurs. By this deformation, atoms on the wire and bonding surface are bonded, and thus a cold weld bond is formed. Bonding is achieved when the cold weld bond is formed.

The ultrasonic wire bonding apparatus is designed to bond one end of a wire to a semiconductor chip, guide the wire to a workpiece, and bond the other end of the wire to the workpiece. Afterwards, by cutting the wire, the above operation is repeated, and another connection operation is performed.

More specifically, as shown in FIG. 9, a capillary 102 is vertically fixed to the end of a horn (an ultrasonic horn) 101 for applying ultrasonic vibrations, and after pressing a lower end of a wire 106 passing through the capillary 102 against the bonding surface of a semiconductor chip (bare chip) 104 placed on a work table 103 with a small pressure and bonding by ultrasonic vibration, the wire 106 is let out slightly and pressed again with a small pressure against a bonding surface of a lead frame 105 supported on the work table 103, and bonded by ultrasonic vibration, and then the wire 106 is cut.

The ultrasonic wire bonding apparatus usually includes an actuator for generating ultrasonic waves, a horn for applying ultrasonic vibrations to transmit excitation ultrasonic waves, and a capillary for holding the wire. The capillary is supported at the lower end of the horn. An electrostrictive vibrator or magnetostrictive vibrator, which is a vibration actuator of electric drive system, is used for generating mechanical vibrations at a frequency in an ultrasonic range. The horn transmits the vibrations generated by the actuator to the capillary by compression waves. Usually, the horn is tapered at its lower end, and is used for amplifying vibrations in the capillary. The capillary holds the wire with the wire slightly projecting from the lower end of the capillary. Afterwards, the lower end of the capillary is pressed against the bonding surface. The capillary oscillates due to the vibrations from the horn, and hence the wire projecting from the lower end of the capillary is bonded to the bonding surface.

The horn, which is necessary for wire bonding, is installed in a device which supports the horn and determines its vertical position. The device is generally mounted on an x-y table which is capable of moving the position of the horn along the horizontal direction of the bonding surface, and constitutes the bonding apparatus. This x-y table slides longitudinally and laterally in order to accurately locate the wire bonding end at a desired position. The wire is vertically positioned by pivoting the horn at its support point. Accordingly, the lower end of the capillary moves vertically along an arc along the lengthwise direction of the capillary.

However, the conventional ultrasonic wire bonding apparatus has the following disadvantages.

One of the major disadvantages of the existing horn design is that a clearance is hardly provided between the workpiece (bonding surface) and the horn because the capillary length is short. As a result, the working area, that is, the bonding range is limited. This is because the horn hits the workpiece at the horn supporting position.

Use of a long horn in order to increase the working area has been considered. However, a long horn has two major disadvantages. A first disadvantage is that the position precision of bonding is lowered because the thermal expansion of the horn is large. To enhance the quality of bonding, a heating table for heating the workpiece is always required. The heat from the table raises the horn temperature, and thus expands the horn. The degree of thermal expansion is greater as the horn becomes longer. Expansion of the horn leads to a lower degree of precision with respect to the position of the bond. A second disadvantage of the long horn is an increase of mass along with a size increase. As the horn mass increases, greater power is needed for oscillating the horn. As the mass increases, greater energy is needed to move a specified distance.

Aside from these two disadvantages, deflection occurs in the horn causing vibration in the vertical direction of the horn, which may cause damage to workpieces such as semiconductor chips.

The other disadvantage due to lack of clearance between the workpiece and horn is the difficulty in bonding wire to a board having large components. In the surface mounting technology known as chip-on-board, a semiconductor chip is mounted directly on a printed circuit board. Since the printed circuit board contains numerous components at various levels of height, it is necessary to ensure that the horn has the proper clearance relative to the components in order to bond the semiconductor chip directly on the printed circuit board.

Another disadvantage of the existing horn design arises from the pivot of the horn used in moving the capillary vertically. The capillary must be perpendicular to the bonding surface for appropriate bonding. Such vertical positioning is required, but since the horn has the pivot, the capillary moves along an arc. Therefore, the pivot angle of the horn is limited to a very small angle. In such horn design, however, wire bonding on a surface of non-uniform height is not possible. That is, the capillary may not always keep be able to maintain a vertical position relative to the bonding surface. Furthermore, the pivoting device is positioned at the end of the horn. Depending on the position and size of the pivoting device, when the horn sufficiently reaches up to above the workpiece, the workpiece touches the pivoting device. This results in a decrease in the working space.

SUMMARY OF THE INVENTION

It is an object of the invention to provide an ultrasonic wire bonding apparatus and method capable of keeping a sufficient clearance between the horn and workpiece, and increasing the working area without using a long horn.

In accomplishing these and other objects, according to one aspect of the present invention, there is provided an ultrasonic wire bonding apparatus including a horn for applying ultrasonic vibrations. The horn has a length corresponding to ½ through 1 wavelength of a vibration wave propagating through a horn material at a primary natural frequency in an axial direction of the horn. The horn material means a bulk material prior to processing fully filled with horn forming material.

Also, a capillary is provided for holding a wire at a front end of the horn in order to transmit ultrasonic vibrations from the horn to an end of the wire passing through the capillary to bond the wire to a bonding surface. The length of the capillary is ¾ inch and the capillary is directly supported at the front end of the horn so as to have a clearance between the horn and the bonding surface which is greater than a height of the highest component on the bonding surface.

According to another aspect of the present invention, there is provided an ultrasonic wire bonding apparatus including a horn for applying ultrasonic vibrations. The horn has a length corresponding to ½ to 1 wavelength of a vibration wave propagating through horn material at a primary natural frequency in an axial direction of the horn. The horn material is a bulk material before processing fully filled with horn forming material.

Also, a capillary is provided for holding a wire at a front end of the horn in order to transmit ultrasonic vibrations from the horn to an end of the wire passing through the capillary to bond the wire to a bonding surface. The capillary is supported at the front end of the horn with a joint in order to have a clearance between the horn and the bonding surface which is greater than the height of the highest component on the bonding surface.

According to another aspect of the present invention, there are provided ultrasonic wire bonding methods which are carried out by using the ultrasonic wire bonding apparatuses. The methods include the steps of moving the capillary by the vibrations from the horn parallel to the bonding surface, and bonding the wire to the bonding surface.

BRIEF DESCRIPTION OF THE DRAWINGS

These and other objects and features of the present invention will become clear from the following description taken in conjunction with the preferred embodiments thereof with reference to the accompanying drawings, in which.

DESCRIPTION OF THE PREFERRED EMBODIMENTS

Figure 1:
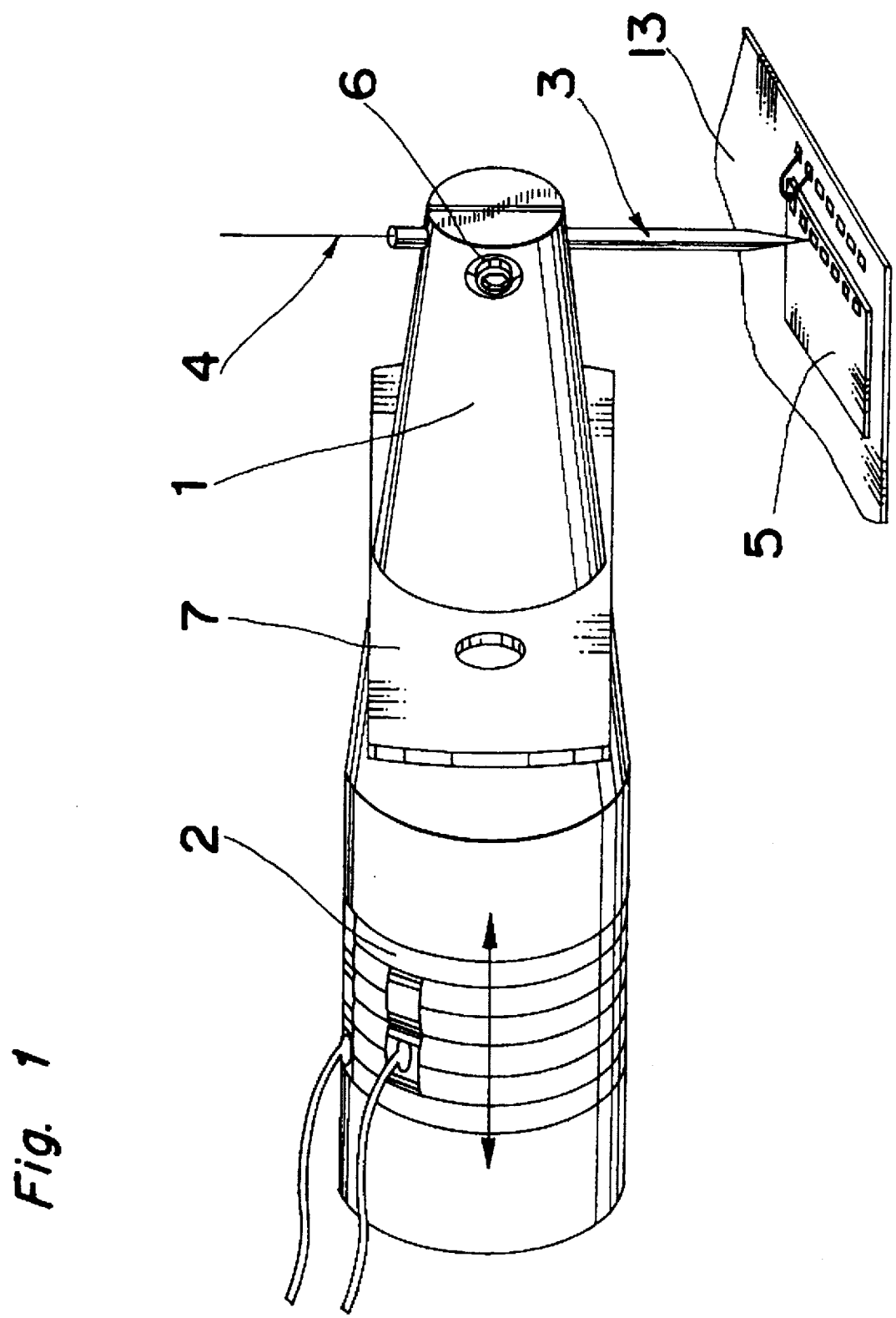
FIG. 1 is a perspective view showing a horn and a capillary etc. of an ultrasonic wire bonding apparatus of a first embodiment of the invention.

Before the description of the present invention proceeds, it is to be noted that like parts are designated by like reference numerals throughout the accompanying drawings.

Some of the embodiments of ultrasonic wire bonding apparatus of the invention are described in detail below. Of course, the invention is not limited to the illustrated examples alone. That is, specific embodiments of the invention are presented and described below, but it must be understood that other changes and modifications would be apparent to those skilled in the art. It should be therefore understood that the scope of the claims is intended to cover all changes and modifications within the true spirit and scope of the invention.

An ultrasonic wire bonding apparatus according to a first embodiment of the invention includes a horn for applying ultrasonic vibrations, and a capillary for holding a wire at the lower end of the horn in which the ultrasonic vibrations from the horn are transmitted to the lowest end of the wire passing through the capillary to bond the wire to the bonding surface. The capillary is directly supported at the lower end of the horn in order to maintain a sufficient clearance between the lowest surface of the horn and the bonding surface.

An ultrasonic wire bonding apparatus according to a second embodiment of the invention includes the parts similar to the first embodiment but in the second embodiment, the capillary is short, and is supported at the lower end of the horn through a joint. The sum of the length of the joint and capillary is enough to provide a sufficient clearance between the lowest surface of the horn and the bonding surface. The sufficient clearance between the lowest surface of the horn and the bonding surface means a distance greater than the height of the highest component on the bonding surface in order to prevent the horn from contacting the component.

Figure 2:
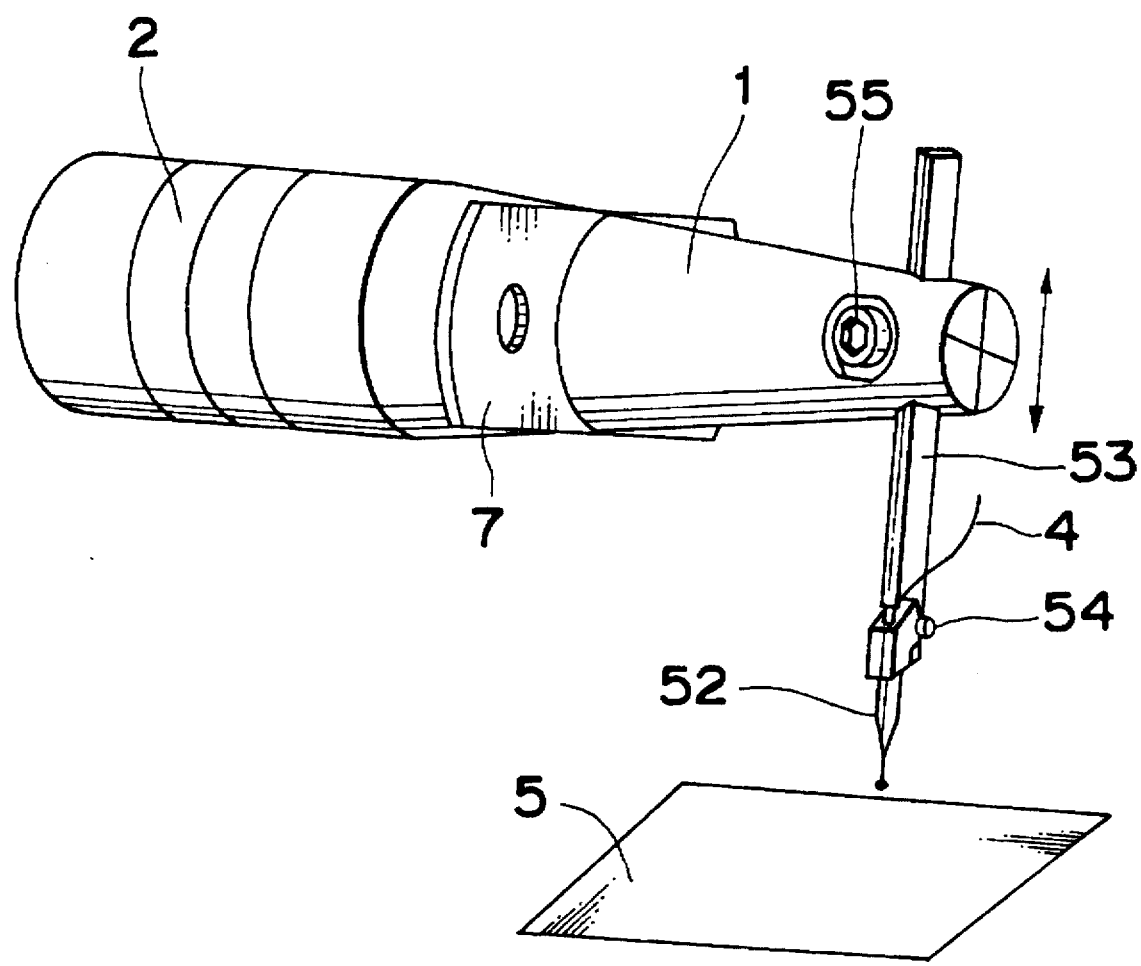
FIG. 2 is a perspective view showing a horn and a capillary etc. of the ultrasonic wire bonding apparatus of a second embodiment of the invention.

That is, in the case of the ultrasonic wire bonding apparatus of the first embodiment, as shown in FIG. 1, a capillary 3, longer than in the prior art, for holding a wire is disposed at the lower end of a horn (an ultrasonic horn) 1 for applying ultrasonic vibrations. The capillary 3 is in a position extending vertically toward a bonding surface 5 (the position with the longitudinal direction directed vertically). The longitudinal direction of the capillary 3 is orthogonal to the axial direction of the horn 1. Or, in the case of the ultrasonic wire bonding apparatus of the second embodiment, as shown in FIG. 2, an ordinary short capillary 52 for holding a wire 4 is disposed at the lower end of the horn 1. The capillary 52 is in a position extending vertically toward the bonding surface (the position with the longitudinal direction of the capillary directed vertically) through a joint or extender 53, and is similarly orthogonal to the axial direction of the horn 1.

The horn 1 is furnished with an electrostrictive vibrator or magnetostrictive vibrator, which is usually a vibration actuator 2 of an electric drive system, as a means for generating ultrasonic vibrations. The reason for using the vibration actuator of the electric drive system is that a high amplitude is obtained with low heat generation because the mechanical internal loss is small and the input/output ratio is large.

The capillary 3 in the first embodiment possesses a length which is enough to maintain a sufficient clearance between the lowest surface of the horn and the bonding surface. The capillary 3 is longer relative to the prior art and has a length in a range of about ½ to 1 inch, and in particular a length of ¾ inch (about 1.9 cm) is preferred from the viewpoint of strength, vibration, and clearance relative to the workpiece. Incidentally, the short capillary of the prior art is less than ½ inch in length.

The capillary 52 in the second embodiment in FIG. 2 is a short capillary, like that of the prior art. The capillary 52 is usually detachably fixed to a joint or extension 53 with a bolt or screw 54. The upper end of joint 53 is fixed in a penetration hole provided at the lower end of the horn 1 with a bolt or screw 55 or the like. The height can be adjusted by loosening the bolt 55, moving the joint 53 up or down, and tightening the bolt 55 again. In the second embodiment, the length which provides sufficient clearance between the lowest surface of the horn 1 and the bonding surface 5 is usually in a range of about 15 to 20 mm, approximately, and more specifically, the length of the capillary 52 alone is usually in a range of about 5 to 10 mm, and the length of the joint 53 alone, about 5 to 15 mm.

The horn 1 is tapered at an end which includes the tip for supporting the capillary 3, and the capillary 52 via the joint 53. The horn 1 is provided so as to sufficiently amplify the vibrations in the capillary 3, 52. For example, the amplitude of the vibrations is 4 μm through 5 μm at 60 kHz.

Figure 3:
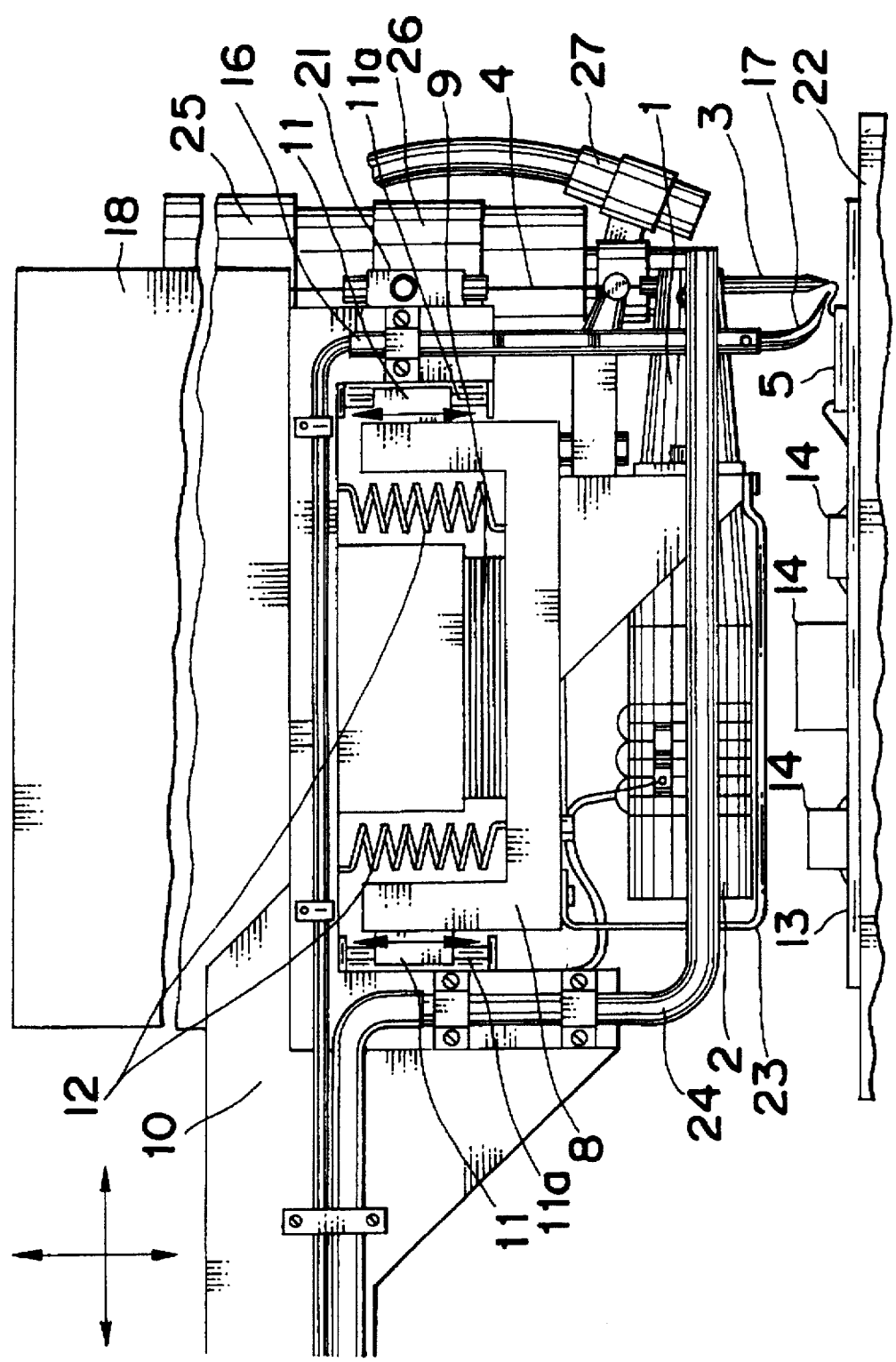
FIG. 3 is a side view of the entire ultrasonic wire bonding apparatus of the first embodiment.

The horn 1 is usually fitted to the horn support unit 8 which keeps the capillary 3, 52 vertical relative to the bonding surface 5 while moving in the vertical direction in order to position the wire 4 accurately. For example, the horn support unit 8 moves in the vertical direction by means of a slider (linear slider) 11 which can slide linearly in the vertical direction by means of a slide shaft 11a, as shown in FIG. 3. The horn support unit 8 is coupled (fitted) to the linear slider 11 for keeping the capillary 3, 52 vertical relative to the bonding surface 5. The horn support unit 8 moves up and down on the ultrasonic wire bonding apparatus which supports the horn support unit.

The position of the horn support unit 8 is usually determined by using an actuator (linear actuator) 9 of the electric drive system. In this case, the horn support unit 8 is suspended and supported by springs 12 from a bonding head 10. With the springs 12, moreover, it is preferred that the impact caused by driving of the electric drive system actuator 9 may be lessened, while alleviating the effect of gravity on the horn support unit 8. The springs 12 are used between the horn support unit and the bonding head 10 in order to counter the effects of gravity acting on the linear actuator 9 to maintain good control of the bonding force between the capillary 3, 52 with an exposed wire 4 and the bonding surface 5. The springs 12 also permits vertical movement of the horn support unit 8. That is, the horn support unit 8 maintains the reaction force while moving, and is also coupled with the springs 12 for lessening the effects of gravity on the horn support unit 8.

Usually, the horn 1 is located beneath the horn support unit 8, i.e. the lower end of the horn 1 is below the lower end of the horn support unit 8, thereby preventing the wire bonding apparatus from contacting the workpiece.

The bonding head 10 of the ultrasonic wire bonding apparatus of the first embodiment of the invention, as shown in FIG. 3, includes a wire feeding system (wire feeding means) for feeding a wire 4 necessary for bonding, and a video camera for positioning the apparatus accurately in a desired position by using computer vision control techniques.

Figure 10:
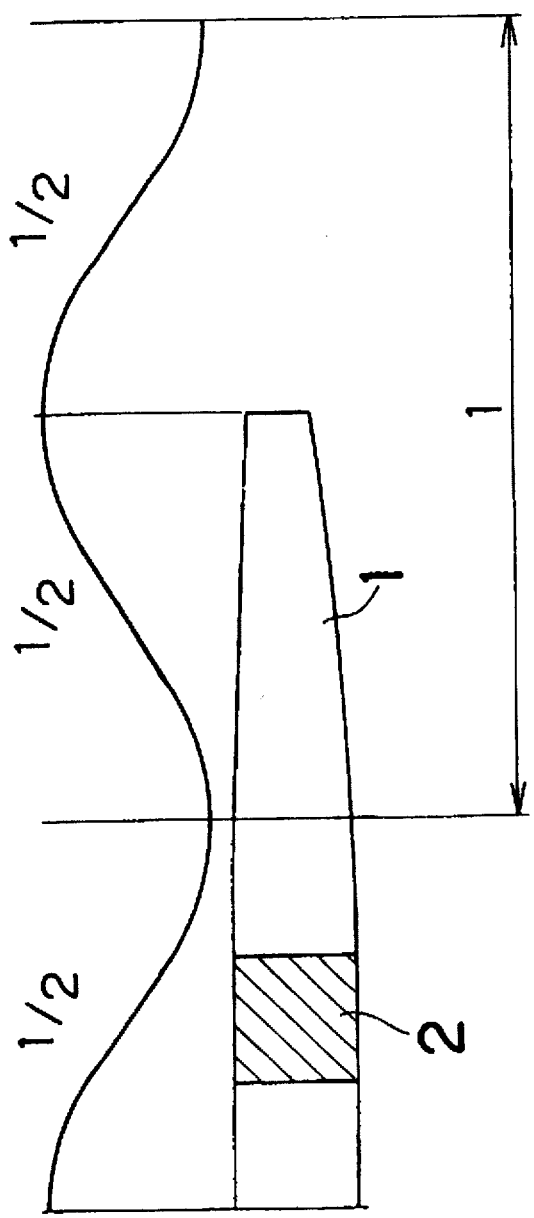
FIG. 10 is a diagram explaining the length of the horn in the embodiment.

A short and small horn is preferred, but the minimum length of the horn 1 i.e. the length from end to end of the horn is a length corresponding to ½ to 1 wavelength, i.e. ½ wavelength to one wavelength of the vibration wave propagating in the horn material at a primary natural frequency in the axial direction of the horn. This is required in order to achieve a favorable horn vibration characteristic. The horn material herein refers to the bulk material, not a hollow horn after processing. Examples of the material include titanium and stainless steel, and a practical dimension is 42 mm, for example. As shown in FIG. 10, based on a computer simulated vibration analysis of the portion including the capillary and the bolt for attaching the capillary to the horn, the length of the horn 1 is determined to be ½ to 1 wavelength of a vibration wave propagating through the horn material with the primary natural frequency in the axial direction of the horn, while satisfying the vibration level of the lower end of the capillary.

The horn 1 is thus mounted on the horn support unit 8 by means of a flange 7 located at the position of a node point (non-vibrating point) of the primary natural vibration mode, and the horn 1 is fixed to the horn support unit 8 through the flange 7. This is in consideration of good transmission and amplification of ultrasonic vibration by the actuator 9 to the capillary 3, 52.

The bonding head 10 also includes a clamp 15, generally, and this clamp 15 is positioned immediately above the horn 1. An electric actuator is used to open and close the clamp 15. The clamp 15 is used for controlling the movement of the wire 4 through the capillary 3, 52. The clamp 15 is open while the horn 1 is connecting between two bonds, and is closed after completion of the connection in order to cut off the remaining wire 4 from the end of the connection in order to start a new connection.

Prior to the first connection, in order to form a ball on an exposed wire 4, a spark unit is used. This spark unit strikes a spark between the wire 4 exposed at the capillary lower end and the spark torch 16. The spark fuses the wire end and forms a tiny ball. This ball is used for a first connection of the wire 4. The spark torch 16 is installed in the bonding head 10 (apparatus support unit) so that the lower end of the torch 17 may come to a position close to the lower end of the capillary 3, 52. Formation of a ball takes place when the horn 1 is at the highest position relative to the wire bonding apparatus. This technique is known as the ball bonding technique. The ultrasonic wire bonding apparatus of the present invention may be constituted so that the wire bonding method of bonding a wire 4 by employing the ball bonding technique may be applied.

Since the horn 1 works above a heating table 22, a piezoelectric actuator 2 may be very hot. A thermal shield 23 is provided beneath the horn 1 to prevent the heat of the heating table 22 from adversely affecting the piezoelectric actuator 2. Furthermore, cold air is blown from the side of the horn 1 through a cooling pipe 24 installed adjacent to the horn 1 to keep the horn 1 and actuator 2 cold. The cold air prevents the thermal diffraction induced by the heating table 22 from adversely affecting the picture quality of the video camera.

Figure 5:
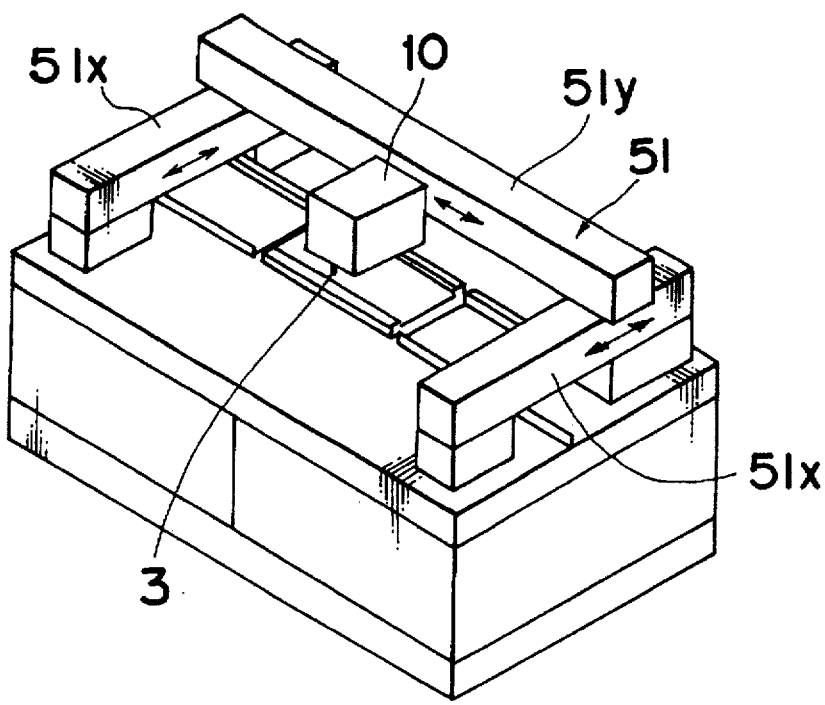
FIG. 5 is a perspective view showing an x-y robot provided with the ultrasonic wire bonding apparatus of the first embodiment of the invention with the horn etc. covered with a cover.

In the case of the first embodiment, as shown in FIG. 5, for example, the bonding head 10 is installed movably in the XY-direction by means of an x-y robot 51 including two first linear robots 51x, movable in the X-direction of the bonding surface, and a second linear robot 51y, movable in the Y-direction of the bonding surface. The bonding head 10 is furnished, as mentioned above, with the horn support unit 8 so as to also be movable in the vertical direction (Z-direction). The bonding head 10 is moved by the x-y robot 51 to a desired position along the horizontal direction (XY-direction), the horn support unit 8 is moved downwardly by the actuator 9 of the bonding head 10 thus lowering the capillary 3 at the lower end of the small horn 1, and the lower end of the wire 4 is fitted to the bonding surface 5 of a workpiece such as a semiconductor chip.

Figure 7:
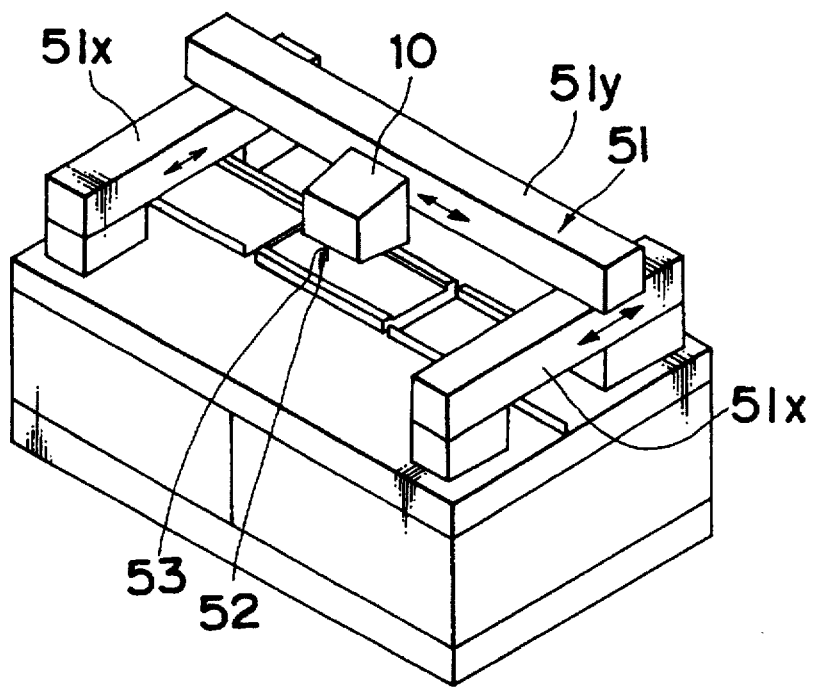
FIG. 7 is a perspective view showing an x-y robot provided with the ultrasonic wire bonding apparatus of the second embodiment of the invention with the horn etc. covered with a cover.

In the case of the second embodiment, as shown in FIG. 7, for example, the bonding head 10 is movable in the XY-direction by means of the x-y robot 51, and the bonding head 10 is provided with the horn support unit 8 so as to be movable in the vertical direction (Z-direction). The bonding head 10 is moved by the x-y robot 51 to a desired position in the horizontal direction (XY-direction), the horn support unit 8 is moved downwardly by the actuator 9 of the bonding head 10 thus lowering the capillary 52 at the lower end of the horn 1, and the lower end of the wire 4 is fitted to the bonding surface 5 of a workpiece, such as a semiconductor chip.

Figure 4:
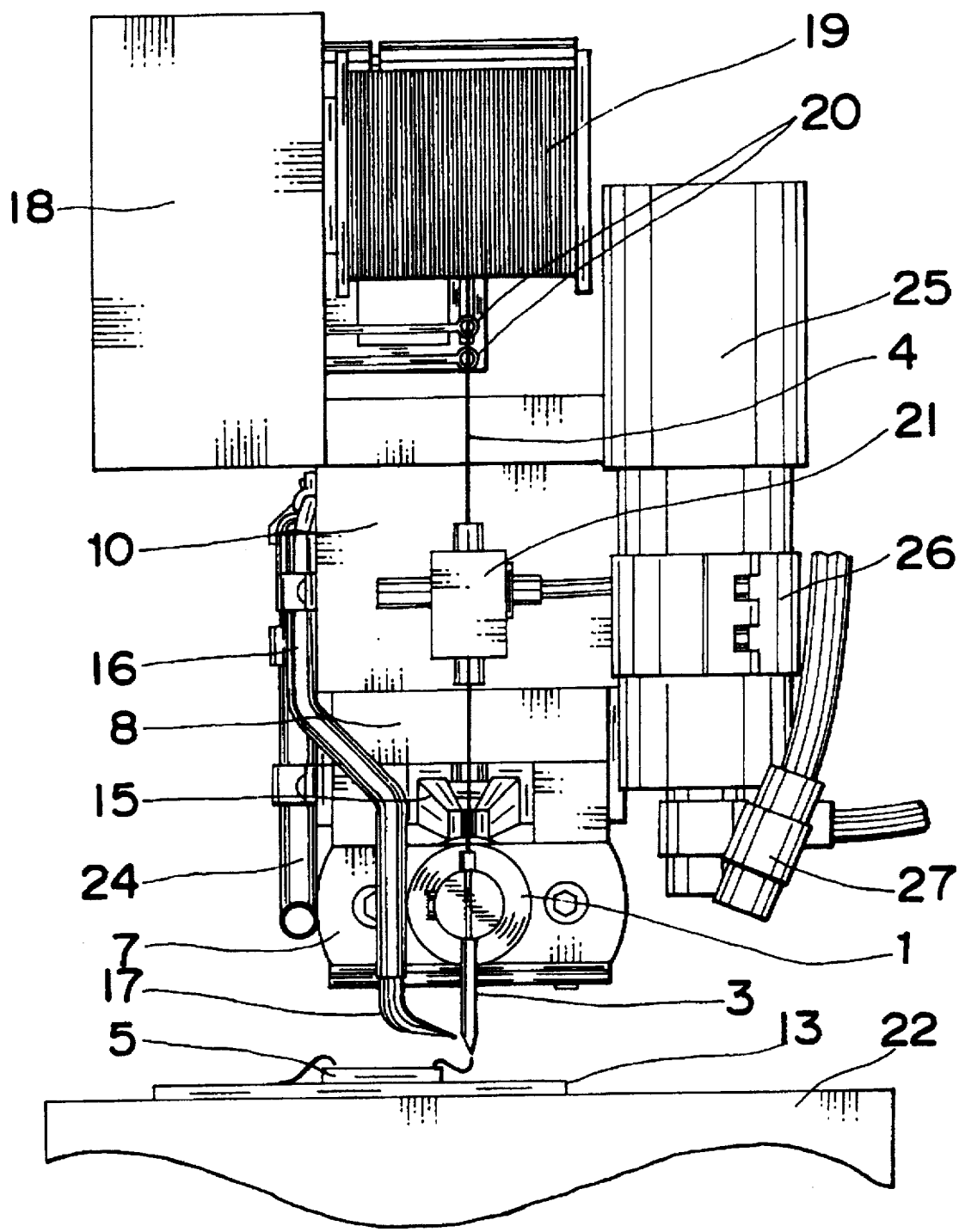
FIG. 4 is a front view of the ultrasonic wire bonding apparatus of the first embodiment.

FIG. 3 is a side view of a bonding apparatus of the first embodiment of the present invention. The arrow on each linear slider 11 indicates the vertical movement direction of the horn support unit 8. The arrows in the upper left portion of FIG. 3 show the movable directions x, z of the apparatus, but the apparatus can also move in the Y-direction which is vertical to the sheet of paper as well. FIG. 4 is a front view of the wire bonding apparatus of the first embodiment. The structure of the ultrasonic wire bonding horn, having the actuator 2 and the capillary 3, is longer than those of the ultrasonic wire bonding apparatus of the prior art. FIG. 1 specifically shows the manner is which the wire bonding takes place.

FIG. 1 shows the horn 1 provided with the piezoelectric actuator 2 and the capillary 3. The actuator 2 generates mechanical vibrations, i.e. vibrations having displacement along the direction indicated by the arrow direction which is along the lengthwise direction of the horn 1. These mechanical vibrations are transmitted as pressure waves through the horn 1. The horn 1 is tapered toward the front end so as to sufficiently amplify the vibrations at the position of the capillary 3. The wire 4 passes through the center of the capillary 3 and is slightly exposed at the capillary front end.

The vibration from the horn 1 moves the capillary 3 parallel to the bonding surface 5, and causes the wire 4 to be bonded to the bonding surface 5. The capillary 3 is press-fitted in a hole provided in the horn 1. A capillary bolt 6 is used for firmly holding the capillary 3 by tightening the grip of the press-fit hole. The horn 1 is supported by the flange 7.

For adequate transmission of vibration, the drive frequency of the actuator 2 must be matched with the frequency of the primary natural vibration mode in the axial direction of the horn 1. Accordingly, the actuator 2 is driven by electric pulses matched with the frequency of the primary natural vibration mode in the axial direction of the horn 1. The electric pulses expand and contract the actuator 2, and generate vibrations corresponding with the frequency of the electric signals. The flange 7 is located at a node point relative to the primary natural vibration mode in the axial direction of the horn 1. It guarantees that the vibration energy is hardly transmitted into the horn support unit 8.

In the ultrasonic wire bonding apparatus, as shown in FIG. 3, the horn 1 is held by the horn support unit 8, and is moved in the vertical direction by the bonding head 10 by means of the two linear sliders 11 that can slide linearly along the vertical direction by the guide of the slide shafts 11a. Therefore, the horn support unit 8 slides in the vertical direction (z-axis) relative to the bonding surface 5 by the linear actuator 9 of electric drive system. The electrically driven linear actuator 9 accurately sets the position of the horn 1 along the z-axis and applies a necessary bonding force to the lower end of the capillary 3 which is required for bonding of the wire 4. The springs 12 are provided between the horn support unit 8 and bonding head 10, and are used for holding the horn support unit 8 in a specified position. By means of the springs 12, the effects of gravity acting on the horn support unit 8 are alleviated, so that accurate position control is realized by the actuator 9.

A first end of the wire 4 is bonded to the bonding surface 5 of a workpiece such as semiconductor chip. Afterwards, the wire bonding apparatus moves to other positions in order to complete the connection. The other end of the wire 4 is bonded to a second bonding surface 13 of a workpiece such as an integrated circuit package or a printed circuit board or the like. For example, the bonding surface 13 of the printed circuit board generally contains some accessory components 14, and hence clearance is needed between the lowest surface of the horn 1 and the bonding surface 13. When the connection of the wire 4 is completed, the wire clamp 15 closes to hold the wire 4 firmly. Later, the horn 1 slides in an upward direction, and cuts off the connection between the wire 4 and the wire 4 left on the bonding surface 13.

When the wire bonding apparatus moves to a new connection location, the wire 4 is slightly exposed at the lower end of the capillary 3. By fusing the lower end of the wire 4 by using the spark torch 16, a ball is formed at the lower end of the wire 4. The spark torch 16 is intended to strike an electric spark on the wire 4 from the lower end of the torch 17. The position of the horn 1 is set and the clamp 15 is opened in order to allow the wire 4 to pass into the capillary 3.

The wire bonding apparatus is constructed as shown in FIG. 5, and can be moved in all directions (x-Y-Z) in order to bond the wire 4 in a selected position on the bonding surfaces 5, 13.

The wire 4 is supplied by means of a wire feeder 18 for feeding a required amount of wire 4 from a wire spool 19 as shown in FIG. 4. The wire 4 is positioned so that the wire 4 may be fed straight into the capillary 3 by means of a wire positioner 20. The tension of the wire 4 is maintained by using a wire tensioner 21. A wire feed sensor (not shown) guarantees that a required amount of wire 4 will be supplied into the wire bonding apparatus.

The bonding surface 13 must be hot so as to realize good bonding of the wire 4. The heating table 22 is used for heating the bonding surface 13. The heat from the heating table 22 heats the ultrasonic actuator 2 of which performance would be adversely affected by the heat. Therefore, the thermal shield 23 is used for isolating the actuator 2 from the heating table 22. The cooling pipe 24 is also used for blowing cold air to the actuator 2 or horn 1 to keep them cold so as to decrease the effect of any heat. The cooling pipe 24 also decreases thermal diffraction which adversely affects the image of the object observed by a video camera 25.

Fine positioning of the wire bonding apparatus is achieved by marking the bonding surface 13 and determining the board position accurately by means of a computer imaging system. The video camera 25 is used for observing the mark on the board. The video camera 25 is installed on the side surface of the bonding head 10 by means of a camera support unit 26. Using an electric light 27, the bonding surface 13 of the board is properly illuminated, and a bright viewing field of the positioning marker is obtained.

FIG. 2 shows the appearance of the horn 1, joint 53, and short capillary 52 of an ultrasonic wire bonding apparatus according to a second embodiment of the present invention. FIG. 7 shows the entire construction of the ultrasonic wire bonding apparatus of the second embodiment. The other detailed structure is the same as in the foregoing first embodiment, and hence illustration thereof is omitted.

As shown in FIG. 7, the bonding head 10 is provided movably in the XY-direction by means of the x-y robot 51. The bonding head 10 is provided with the horn support unit 8 on which the horn 1 is fixed, so as to be movable in a vertical direction (Z-direction).

As shown in FIG. 2, the horn 1 is fixed on the horn support unit 8 by means of the flange 7. The rear end of the joint 53 is inserted into the penetration hole at the front end of the horn 1 and is fixed with the bolt 55. The capillary 52 is fixed to the lower end of the joint 53 with the bolt 54. The projecting amount of the joint 53 can be adjusted by loosening the bolt 55, and the capillary 52 can be replaced by loosening the bolt 54.

The horn 1 is a small horn having a length corresponding to ½ wavelength of the vibration wave propagated with the primary natural frequency in the axial direction in the horn material. The flange 7 is located at the node point of the primary natural vibration mode in the axial direction of the horn 1.

Figure 8:
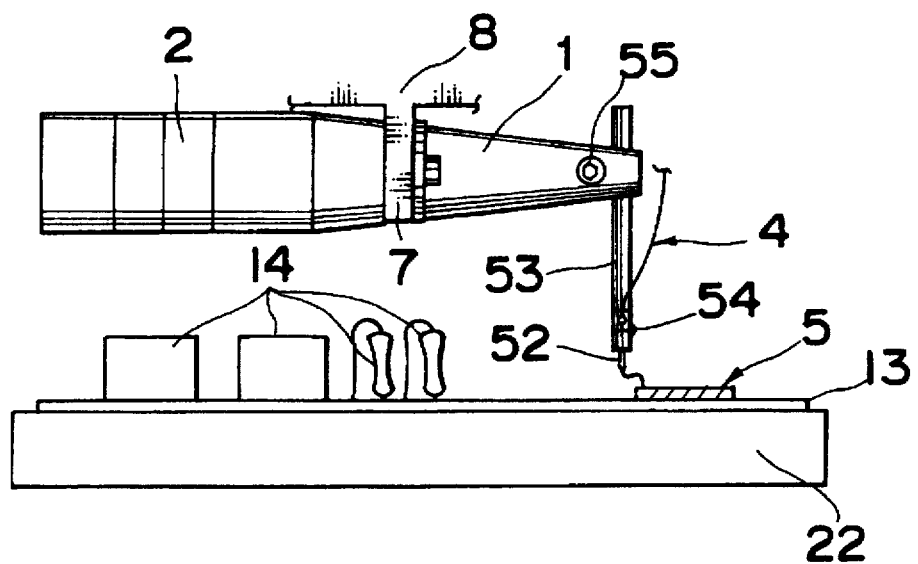
FIG. 8 is a side view showing the horn and the capillary of an ultrasonic wire bonding apparatus in the second embodiment.
Figure 9:
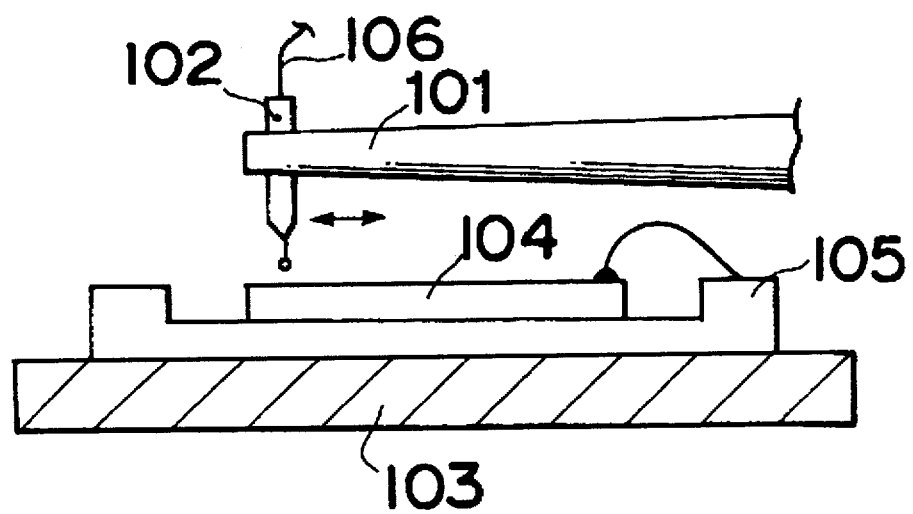
FIG. 9 is a side view showing a horn capillary of a conventional ultrasonic wire bonding apparatus.

By means of the x-y robot 51, the bonding head 10 is moved to a desired position in the horizontal XY direction and the horn support unit 8 is moved downwardly by the actuator 9 of the bonding head 10. As shown in FIG. 8, the capillary 52 at the lower end of the horn 1 is lowered to fit the lower end of the wire 4 to the bonding surface 5 of the workpiece such as a semiconductor chip at a small amount of pressure. While applying the vibration of the actuator 2 by about 5 μm at the lower end of the capillary 52 through the horn 1, the bonding surface 5 of the semiconductor chip and the bonding surface 13 of the workpiece are bonded with the wire 4. Because of the joint 53, bonding is realized even though there is a mounted component 14 taller than the semiconductor chip.

Figure 6:
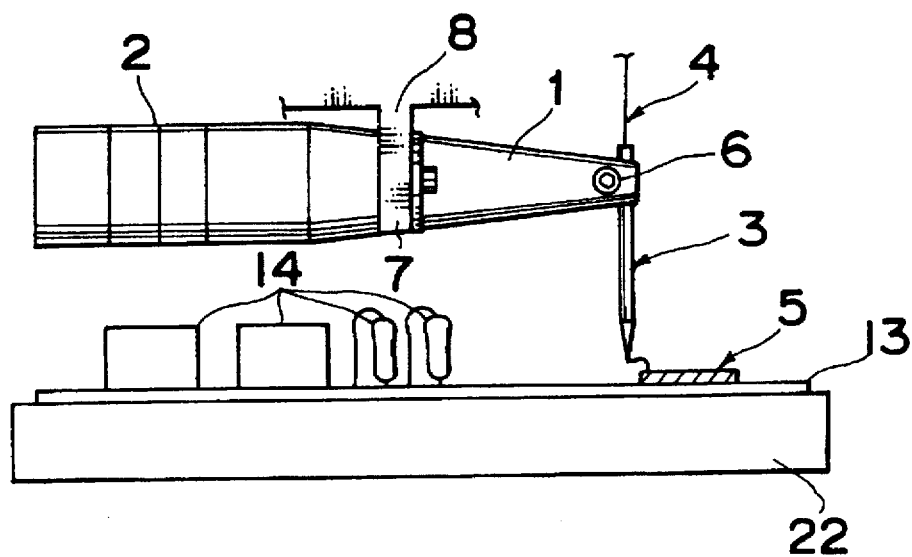
FIG. 6 is a side view showing a horn and a capillary of an ultrasonic wire bonding apparatus of a third embodiment of the present invention.

FIG. 6 shows the horn 1 and the capillary 3 of the third embodiment of the present invention which is longer than the ultrasonic wire bonding apparatus of the prior art. FIG. 5 shows the entire construction of the ultrasonic wire bonding apparatus of the third embodiment. The other specific structure is the same as in the first embodiment, and hence illustration thereof is omitted. That is, the ultrasonic wire bonding apparatus of the third embodiment is the same as in the first embodiment, except that the dimension of the capillary 3 is ¾ inch, and is hence described briefly below.

As shown in FIG. 5, the bonding head 10 is movable in the XY-direction through the x-y robot 51. The bonding head 10 is provided with support unit 8 on which the horn 1 is fixed, so as to be movable in a vertical direction (Z-direction).

As shown in FIG. 6, the horn 1 is fixed to the horn support unit 8 by means of the flange 7. The ¾-inch capillary 3 is fixed at the end of the horn 1 with the bolt or screw 6. By loosening the bolt 6, the capillary 3 can be replaced.

The horn 1 is a small horn having a length corresponding to ½ wavelength of a vibration wave propagated with the primary natural frequency in the axial direction in the horn material. The flange 7 is located at the node point of the primary natural vibration mode in the axial direction of the horn 1.

The bonding head 10 is moved by the x-y robot 51 to a desired position in the horizontal XY direction. The horn support unit 8 is moved downwardly by the actuator 9 of the bonding head 10, and, as shown in FIG. 6, the capillary 3 at the lower end of the horn 1 is lowered to fit the lower end of the wire 4 to the bonding surface 5 of the workpiece at a small pressure. While applying the vibration of the actuator 2 at about 5 μm at the lower end of the capillary 3 through the horn 1, the bonding surface 5 of the semiconductor chip and the bonding surface 13 of the workpiece are bonded with the wire 4. Using the capillary 3, bonding is achieved even though a component 16 is taller than the semiconductor chip which is mounted on the workpiece.

In the ultrasonic wire bonding apparatus of the present invention, since the horn is provided with a capillary longer than that of the prior art or a capillary extended through a joint, sufficient clearance is maintained between the bonding surface and the lowest surface of the horn. As a result, the wire bonding apparatus can function without being impeded above the heating table, and collision of the horn against the workpiece may be avoided. Wire bonding takes place at the capillary lower end through contact with the bonding surface. Due to the sufficient clearance between the lowermost surface of the horn and the capillary lower end, the horn can work above the bonding surface while bonding the wire. Hence the horn is able to move freely to any position on the bonding surface, thus increasing the working area. Moreover, since there is sufficient clearance between the bonding surface and the lowermost surface of the horn, the wire can be bonded to a board having components mounted thereon.

In addition, a long horn is no longer needed, as a small horn is sufficient. Accordingly, only a small amount of power is required for horn vibration, and the disadvantages of thermal expansion by the heating table are also decreased. Moreover, the weight of the bonding head 10 can be reduced so as to allow the bonding operation to proceed at a higher speed.

When the length of the capillary is ¾ inch, the strength, vibration, and clearance in relation to the workpiece are appropriate.

When the joint is installed in the horn so that the height of the capillary along the vertical direction is adjustable, the projecting extent of the joint can be adjusted. Therefore, the vibration amplitude at the capillary lower end can be adjusted without modifying the horn structure.

Since the capillary is detachable from the joint, the capillary can be replaced without replacing the joint.

When the horn is provided with an electric drive system actuator as the means for inducing ultrasonic vibrations, the input/output ratio is large since the mechanical internal loss is small. Also a high amplitude is obtained at levels of low heat generation, so that it is easy to process into various shapes.

When the horn is tapered toward the front end, the ultrasonic vibration is amplified, and a sufficient ultrasonic vibration can be transmitted to the lower end of the wire.

When the length of the horn corresponds to ½ through 1 wavelength of a vibration wave propagating through the horn material with the primary natural frequency in the horn axial direction, a sufficient ultrasonic vibration can be transmitted to the capillary by a small horn.

When the horn is fixed in the horn support unit by a flange at the position of a node point of the primary natural vibration mode in the horizontal direction, the ultrasonic vibration energy can be sufficiently transmitted to the capillary without any loss. Moreover, as compared with the conventional apparatus wherein the whole of the horn is supported by a supporting member, the horn is supported by a flange so that the weight of the supporting member can be reduced. When the flange projects only in the horizontal direction relative to the horn, not in the lower direction, the desired clearance between the horn and the bonding surface can be certainly maintained.

When the horn support unit on which the horn is mounted is movable in the vertical direction by a slider, which can slide linearly in the vertical direction along the slide shaft, the capillary can be kept vertical relative to the bonding surface while moving vertically for accurately positioning the wire, so that appropriate bonding can be achieved.

In the case of linear movement of the horn support unit in the vertical direction by the electric drive system actuator, it is advantageous that the capillary and the workpiece can always contact orthogonally relative to each other.

When the horn support unit is suspended and supported from above by a spring, it is advantageous that the spring alleviates the impact caused by driving the electric drive system actuator, and lessens the effects of gravity applied on the horn support unit.

When the horn is located beneath the horn support unit, it is advantageous that not contact the workpiece.

Although the present invention has been fully described in connection with the preferred embodiments, with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An ultrasonic wire bonding apparatus comprising:
   a bonding head;
   a horn support unit;
   at least one slide shaft mounted on said bonding head;
   at least one linear slider coupled to said horn support unit and slidably engaged with said at least one slide shaft;
   at least one spring having a first end connected to said bonding unit and a second end connected to said horn support unit;
   a horn for applying ultrasonic vibrations, said horn being connected to said horn support unit and having a front end, wherein said horn has a length corresponding to ½ to 1 wavelength of a vibration wave propagating through horn material at a primary natural frequency along an axial direction of said horn;
   a capillary for holding a wire, said capillary being supported at said front end of said horn for transmitting ultrasonic vibrations from said horn to a wire held by said capillary; and
   an electrically driven linear actuator, mounted between said bonding head and said horn support unit, for moving said horn support unit.

2. The ultrasonic wire bonding apparatus as claimed in claim 1, wherein said capillary has a length of ¾ inch and is supported in a bore formed in said horn.

3. The ultrasonic wire bonding apparatus as claimed in claim 1, wherein said horn includes a means for generating ultrasonic vibrations which is one of an electrostrictive vibrator and a magnetostrictive vibrator.

4. The ultrasonic wire bonding apparatus as claimed in claim 1, wherein said horn is tapered toward said front end.

5. The ultrasonic wire bonding apparatus as claimed in claim 1, wherein said horn is positioned beneath said horn support unit.

6. The ultrasonic wire bonding apparatus as claimed in claim 1, wherein said horn includes a flange for mounting said horn on said horn support unit, and said flange is positioned at a node point of a primary natural vibration mode along the axial direction of said horn.

7. The ultrasonic wire bonding apparatus as claimed in claim 6, further comprising:
   a X-Y robot including a first linear robot movable along an X direction of a bonding surface; and
   a second linear robot movable along a Y-direction of a bonding surface, wherein said bonding head is supported by said X-Y robot.

8. An ultrasonic wire bonding apparatus comprising:
   a bonding head;
   a horn support unit;
   at least one slide shaft mounted on said bonding head;
   at least one linear slider coupled to said horn support unit and slidably engaged with said at least one slide shaft;
   at least one spring having a first end connected to said bonding unit and a second end connected to said horn support unit;
   a horn for applying ultrasonic vibrations, said horn being connected to said horn support unit and having a front end, wherein said horn has a length corresponding to ½ to 1 wavelength of a vibration wave propagating through horn material at a primary natural frequency along an axial direction of said horn;
   a capillary for holding a wire and transmitting ultrasonic vibrations from said horn to a wire held by said capillary;
   an extension member adjustably mounted at said front end of said horn, wherein said capillary is attached to said extension member; and
   an electrically driven linear actuator, mounted between said bonding head and said horn support unit, for moving said horn support unit.

9. The ultrasonic wire bonding apparatus as claimed in claim 8, wherein said capillary is detachable from said extension member.

10. The ultrasonic wire bonding apparatus as claimed in claim 8, wherein said horn includes a bore through said front end of said bore, and said extension member is inserted in said bore.

11. The ultrasonic wire bonding apparatus as claimed in claim 8, wherein said horn includes a means for generating ultrasonic vibrations which is one of an electrostrictive vibrator and a magnetostrictive vibrator.

12. The ultrasonic wire bonding apparatus as claimed in claim 8, wherein said horn is tapered toward said front end.

13. The ultrasonic wire bonding apparatus as claimed in claim 8, wherein said horn is positioned beneath said horn support unit.

14. The ultrasonic wire bonding apparatus as claimed in claim 8, wherein said horn includes a flange for mounting said horn on said horn support unit, said flange is positioned at a node point of a primary natural vibration mode along the axial direction of said horn.

15. The ultrasonic wire bonding apparatus as claimed in claim 14, further comprising:

a X-Y robot including a first linear robot movable along an X direction of a bonding surface; and a second linear robot movable along a Y-direction of a bonding surface, wherein said bonding head is supported by said X-Y robot.

16. A method of bonding a wire on a bonding surface with an ultrasonic wire bonding apparatus including:

a bonding head;

a horn support unit;

at least one slide shaft mounted on said bonding head;

at least one linear slider coupled to said horn support unit and slidably engaged with said at least one slide shaft;

at least one spring having a first end connected to said bonding unit and a second end connected to said horn support unit;

a horn for applying ultrasonic vibrations, said horn being connected to said horn support unit and having a front end, wherein said horn has a length corresponding to ½ to 1 wavelength of a vibration wave propagating through horn material at a primary natural frequency along an axial direction of said horn;

a capillary for holding a wire, said capillary being supported at said front end of said horn for transmitting ultrasonic vibrations from said horn to a wire held by said capillary; and an electrically driven linear actuator, mounted between said bonding head and said horn support unit, for moving said horn support unit, the method comprising:

positioning said capillary relative to a bonding surface;

moving said capillary parallel to said bonding surface by vibrations transmitted from said horn; and bonding a wire to said bonding surface.

17. A method of bonding a wire on a bonding surface with an ultrasonic wire bonding apparatus, said apparatus including:

a bonding head;

a horn support unit;

at least one slide shaft mounted on said bonding head;

at least one linear slider coupled to said horn support unit and slidably engaged with said at least one slide shaft;

at least one spring having a first end connected to said bonding unit and a second end connected to said horn support unit;

a horn for applying ultrasonic vibrations, said horn being connected to said horn support unit and having a front end, wherein said horn has a length corresponding to ½ to 1 wavelength of a vibration wave propagating through horn material at a primary natural frequency along an axial direction of said horn;

a capillary for holding a wire and transmitting ultrasonic vibrations from said horn to a wire held by said capillary;

an extension member adjustably mounted at said front end of said horn, wherein said capillary is attached to said extension member; and an electrically driven linear actuator, mounted between said bonding head and said horn support unit, for moving said horn support unit, the method comprising:

positioning said capillary relative to a bonding surface;

moving said capillary parallel to said bonding surface by vibrations transmitted from said horn; and bonding a wire to said bonding surface.

* * * * *